United States Patent
Yonezawa et al.

(10) Patent No.: US 8,901,906 B2
(45) Date of Patent: Dec. 2, 2014

(54) CONTROL CIRCUIT AND ELECTRONIC APPARATUS USING THE SAME

(71) Applicant: Fujitsu Limited, Kawasaki-shi, Kanagawa (JP)

(72) Inventors: Yu Yonezawa, Sangamihara (JP); Yoshiyasu Nakashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 246 days.

(21) Appl. No.: 13/633,430

(22) Filed: Oct. 2, 2012

(65) Prior Publication Data

US 2013/0099768 A1    Apr. 25, 2013

(30) Foreign Application Priority Data

Oct. 25, 2011    (JP) .................................. 2011-234422

(51) Int. Cl.
| | |
|---|---|
| G05F 1/40 | (2006.01) |
| H03K 17/06 | (2006.01) |
| H02M 1/08 | (2006.01) |
| H03K 17/0412 | (2006.01) |
| H02M 3/158 | (2006.01) |
| H02M 1/00 | (2006.01) |

(52) U.S. Cl.
CPC .......... *H03K 17/04123* (2013.01); *H03K 17/06* (2013.01); *H02M 1/08* (2013.01); *H02M 2001/0054* (2013.01); *Y02B 70/1491* (2013.01); *Y02B 70/1483* (2013.01); *H02M 3/158* (2013.01)
USPC ........................................................ 323/282

(58) Field of Classification Search
USPC .............. 323/265, 282, 283, 311; 363/62, 63; 327/530, 535
See application file for complete search history.

(56) References Cited

U.S. PATENT DOCUMENTS

| | | | |
|---|---|---|---|
| 2,916,631 A * | 12/1959 | Hoffman | 250/214 R |
| 2,921,203 A * | 1/1960 | Hoffman | 250/214 R |
| 5,528,132 A | 6/1996 | Doluca | |
| 5,929,665 A * | 7/1999 | Ichikawa et al. | 327/109 |
| 6,091,234 A | 7/2000 | Kitagawa | |
| 6,246,280 B1 * | 6/2001 | Morishita | 327/535 |
| 6,707,703 B2 * | 3/2004 | Kawashima | 365/145 |
| 7,020,407 B2 * | 3/2006 | Nakata et al. | 399/66 |
| 8,013,661 B2 * | 9/2011 | Xiong | 327/530 |
| 2002/0057599 A1 * | 5/2002 | Miyawaki et al. | 365/185.22 |
| 2009/0102543 A1 * | 4/2009 | Xiong | 327/530 |

FOREIGN PATENT DOCUMENTS

| | | |
|---|---|---|
| JP | 11-220874 | 8/1999 |
| JP | 2002-132398 | 5/2002 |
| JP | 2007-159364 | 6/2007 |
| JP | 102769379 A * | 1/2014 |

* cited by examiner

*Primary Examiner* — Adolf Berhane
(74) *Attorney, Agent, or Firm* — Staas & Halsey LLP (57) ABSTRACT

A control circuit includes: a first switching device that includes a source, a gate, and a drain; a negative voltage generating circuit that generates, from a pulse width modulation signal that controls the gate of the first switching device, a negative potential voltage which is equal to or smaller than a threshold of the first switching device; a gate control circuit that outputs a signal obtained by shifting a level of the pulse width modulation signal by an amount equal to the negative potential voltage to the gate of the first switching device; a second switching device that is disposed on a side of the drain of the first switching device; and a negative voltage detecting circuit that outputs a signal for turning ON the second switching device upon detecting that the negative potential voltage generated by the negative voltage generating circuit has reached a predetermined negative potential.

5 Claims, 7 Drawing Sheets

CONTROL CIRCUIT AND ELECTRONIC APPARATUS USING THE SAME

CROSS-REFERENCE TO RELATED APPLICATION

This application is based upon and claims the benefit of priority of the prior Japanese Patent Application No. 2011-234422, filed on Oct. 25, 2011, the entire contents of which are incorporated herein by reference.

FIELD

The embodiments discussed herein are related to a control circuit and an electronic apparatus using the control circuit.

BACKGROUND

Nowadays, saving energy resources in various fields is becoming a major concern among people, and this trend is also growing in the field of power supplies. More specifically, there is an increasing demand that switching power supplies become even more efficient.

A switching power supply serves to convert an input direct current (DC) voltage into a desired DC voltage by using a DC-DC converter and to output the converted DC voltage as a stabilized power supply voltage. As the voltage is becoming lower and the power consumption is becoming larger in a power supply, as a semiconductor device, such as a central processing unit (CPU), used in a computer, a switching power supply that is able to output a low voltage and a large current is coming into use.

The following is reference document:
[Document 1] Japanese Laid-open Patent Publication No. 11-220874

SUMMARY

According to an aspect of the invention, a control circuit includes: a first switching device that includes a source, a gate, and a drain; a negative voltage generating circuit that generates, from a pulse width modulation signal that controls the gate of the first switching device, a negative potential voltage which is equal to or smaller than a threshold of the first switching device; a gate control circuit that outputs a signal obtained by shifting a level of the pulse width modulation signal by an amount equal to the negative potential voltage to the gate of the first switching device; a second switching device that is disposed on a side of the drain of the first switching device; and a negative voltage detecting circuit that outputs a signal for turning ON the second switching device upon detecting that the negative potential voltage generated by the negative voltage generating circuit has reached a predetermined negative potential.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
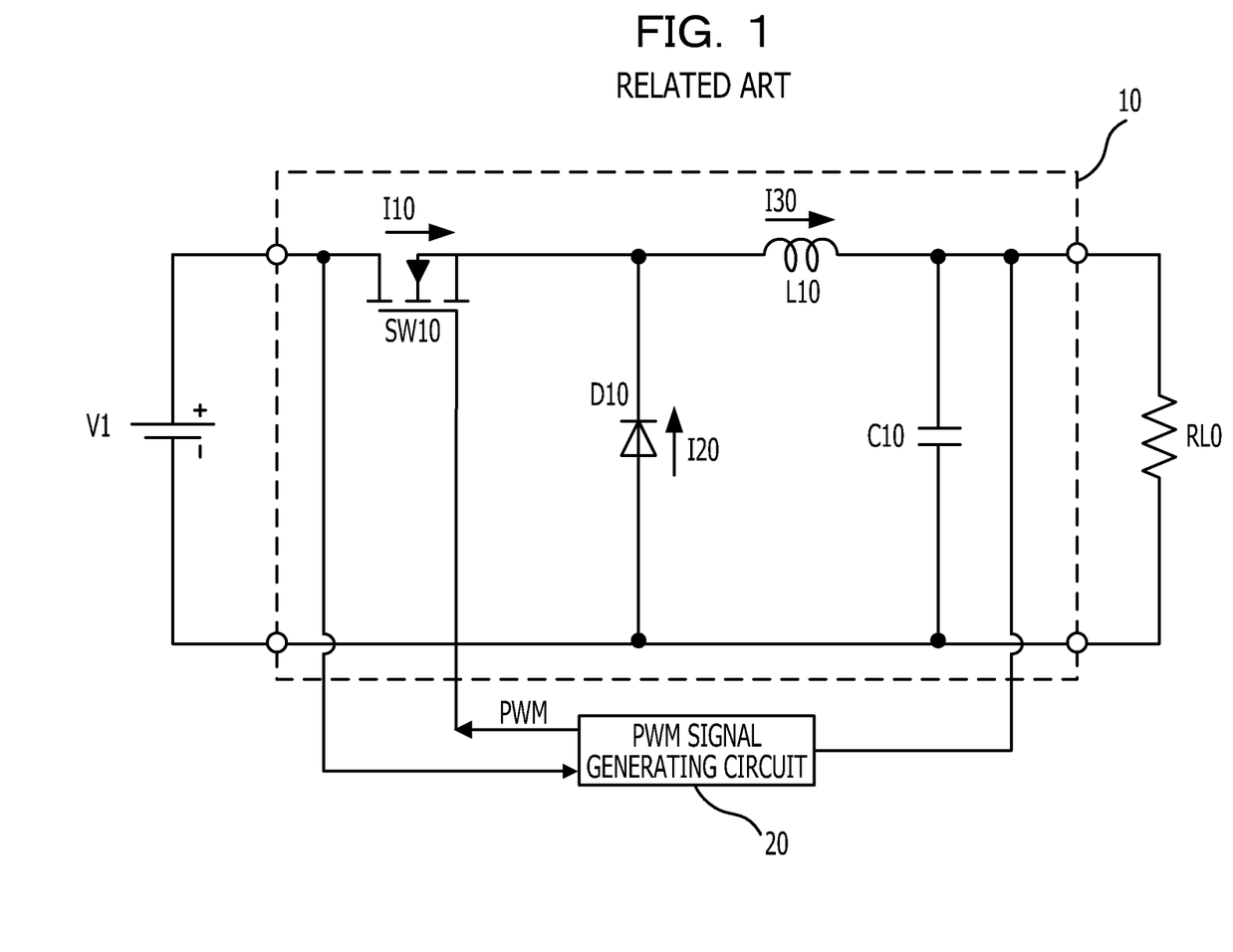
FIG. 1 is a circuit diagram illustrating a general step-down converter.

FIG. 1 is a circuit diagram illustrating a general step-down converter 10, which is one type of DC-DC converter.

The step-down converter 10 illustrated in FIG. 1 steps down an input voltage supplied from a DC power supply V1 so as to generate an output voltage of a desired potential, and then outputs the generated output voltage to a load circuit RL0. The step-down converter 10 includes a switching device SW10 that turns ON/OFF an input voltage supplied from the DC power supply V1, a rectifier diode D10, an inductor L10, and a smoothing capacitor C10. The switching device SW10 serves as a main switch.

As the switching device SW10, a metal oxide semiconductor field-effect transistor (MOSFET), for example, is used. As a result of applying a pulsating gate voltage from a pulse width modulation (PWM) signal generating circuit 20, the switching device SW10 is turned ON/OFF and is PWM driven.

As the rectifier diode D10, any type of diode may be used as long as the rectifying direction is a direction in which a current flows from a negative polarity of the DC power supply V1 to the inductor L10. A fast recovery diode or a silicon carbide (SiC) Schottky diode, for example, may be used.

Figure 2:
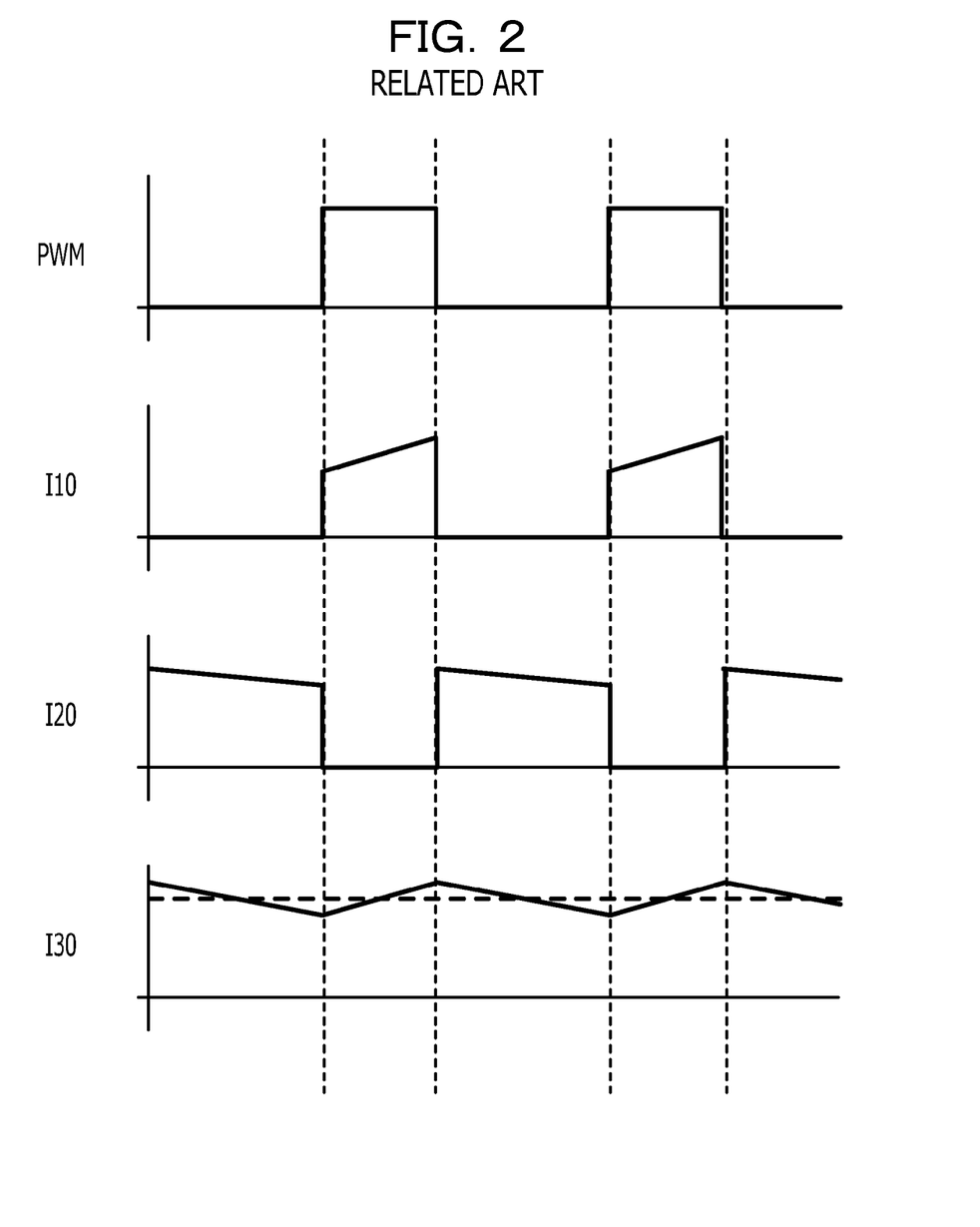
FIG. 2 illustrates an operation of a step-down converter.

The operation of the step-down converter 10 will be discussed below with reference to a timing chart of FIG. 2. In the timing chart, the horizontal axis indicates the time, and the vertical axis indicates a voltage value or a current value.

A PWM signal which controls the ON/OFF operation of the switching device SW10 is applied from the PWM signal generating circuit 20 to the gate of the switching device SW10. When the PWM signal is turned ON, a current I10 flows from the DC power supply V1 to the inductor L10 through the switching device SW10, and meanwhile, energy is stored in the inductor L10, thereby causing the current I10 to gradually increase over time.

Then, when the PWM signal is turned OFF, the switching device SW10 is also turned OFF, thereby causing the current I10 to immediately become zero. A current I30 flowing through the inductor L10 continues flowing due to an inertial force, and thus, a current I20 flows through the rectifier diode D10 and is gradually attenuated. In this manner, as a result of repeatedly turning ON/OFF the switching device SW10, the current I30 flowing through the inductor L10 is converted into the sum of the currents I10 and I20, i.e., the current I30 is converted into a DC which contains DC components and ripple components repeating monotonic increase and monotonic decrease.

The smoothing capacitor C10 performs a smoothing operation on the current I30 by removing the ripple components from the current I30, and the current I30 is output to the load circuit RL0 as a DC current stepped down to a predetermined DC. The DC voltage output to the load circuit RL0 may be adjusted by changing the duty ratio of the PWM signal which controls the ON/OFF operation of the gate of the switching device SW10.

In order to further improve the output efficiency of a step-down converter, it is desirable, for example, to reduce power consumed in a switching device (switching transistor) used in the step-down converter. The power consumption in the switching transistor may be due to the presence of resistance components between the source and the drain while the switching transistor is in the ON state, which is called the "ON resistance", and may be due to so-called "switching loss" caused in the transition state while the switching transistor is being switched between ON and OFF.

Figure 3:
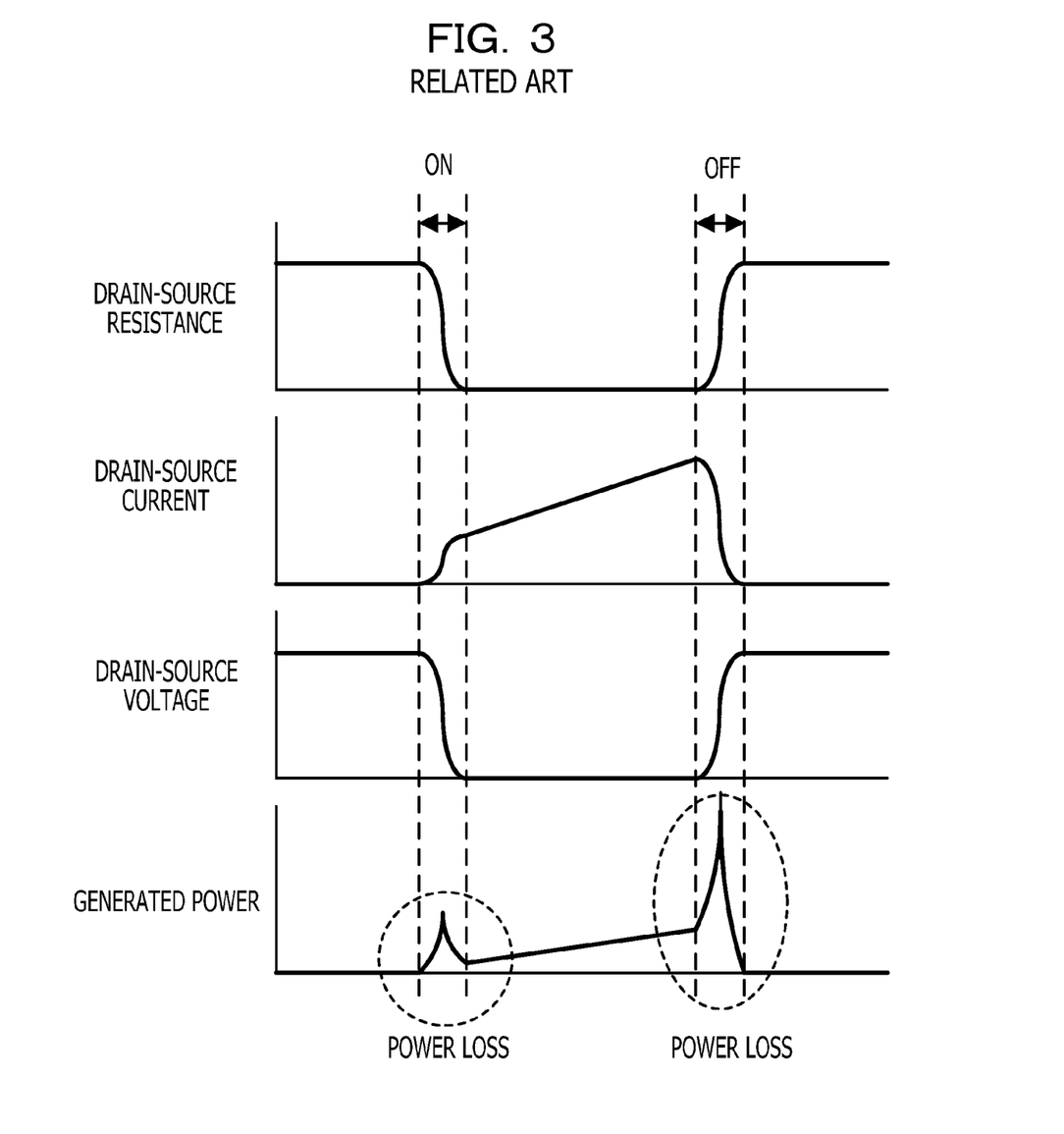
FIG. 3 illustrates loss caused in a switching device.

FIG. 3 illustrates the switching loss caused in a switching transistor. The switching transistor is switched between ON and OFF by utilizing its properties in which the drain-source resistance varies in response to a voltage applied between the gate and the source.

Problems, such as power consumption, due to the ON resistance of the switching transistor are caused while the switching transistor is in the ON state. That is, when a current flows through the switching transistor while the switching transistor is in the ON state, according to Ohm's law, a voltage is generated across terminals of the switching transistor between which the current flows, because of the ON resistance and the current.

In this case, power consumed in the switching transistor is expressed by the product of a current flowing through the switching transistor and a voltage generated across the terminals. The power consumed in the switching transistor is not extracted as an output of the switching power supply, but is transformed into heat in the switching transistor, thereby causing power loss.

The so-called "switching loss" occurring in the transition state while the switching transistor is being switched between ON and OFF is caused due to the presence of a switching time at which neither of a current or a voltage is zero while the switching transistor is being switched between ON and OFF. If a change in the current/voltage in the transition state of the switching transistor is approximately indicated by a linear function with respect to the time, the switching loss may be expressed by current×voltage×switching time/2. Accordingly, in order to reduce the switching loss, it is desirable to increase the drive capability, i.e., the switching speed, of the switching transistor.

Thus, in order to reduce power loss in the above-described switching device, it is desirable to utilize a switching device having a small ON resistance and a high switching speed. As such a switching device that satisfies both the properties, a high electron mobility transistor (HEMT) using gallium nitride (GaN), which is a compound semiconductor material, instead of using silicon has been developed. Hereinafter such a switching transistor will be referred to as a "GaN-HEMT".

That is, most of the compound semiconductors have a larger electron mobility and a larger transconductance than silicon, thereby making it possible to decrease the ON resistance, and the capacitance across terminals of a switching transistor is also small.

A known MOSFET using silicon is of a normally OFF switching type (enhancement type) in which the transistor is OFF when a voltage is not applied to the gate. In contrast, a GaN-HEMT is, generally, of a normally ON switching type (depletion type) in which the transistor is ON when a voltage is not applied to the gate. Accordingly, in order to switch ON a GaN-HEMT, a voltage is applied by using a negative power supply circuit.

However, if the negative power supply circuit breaks down and fails to apply a negative voltage, a GaN-HEMT is caused to be in the ON state, which may output undesirable power.

Preferred embodiments of the present technology will be described below in detail with reference to the accompanying drawings.

Figure 4:
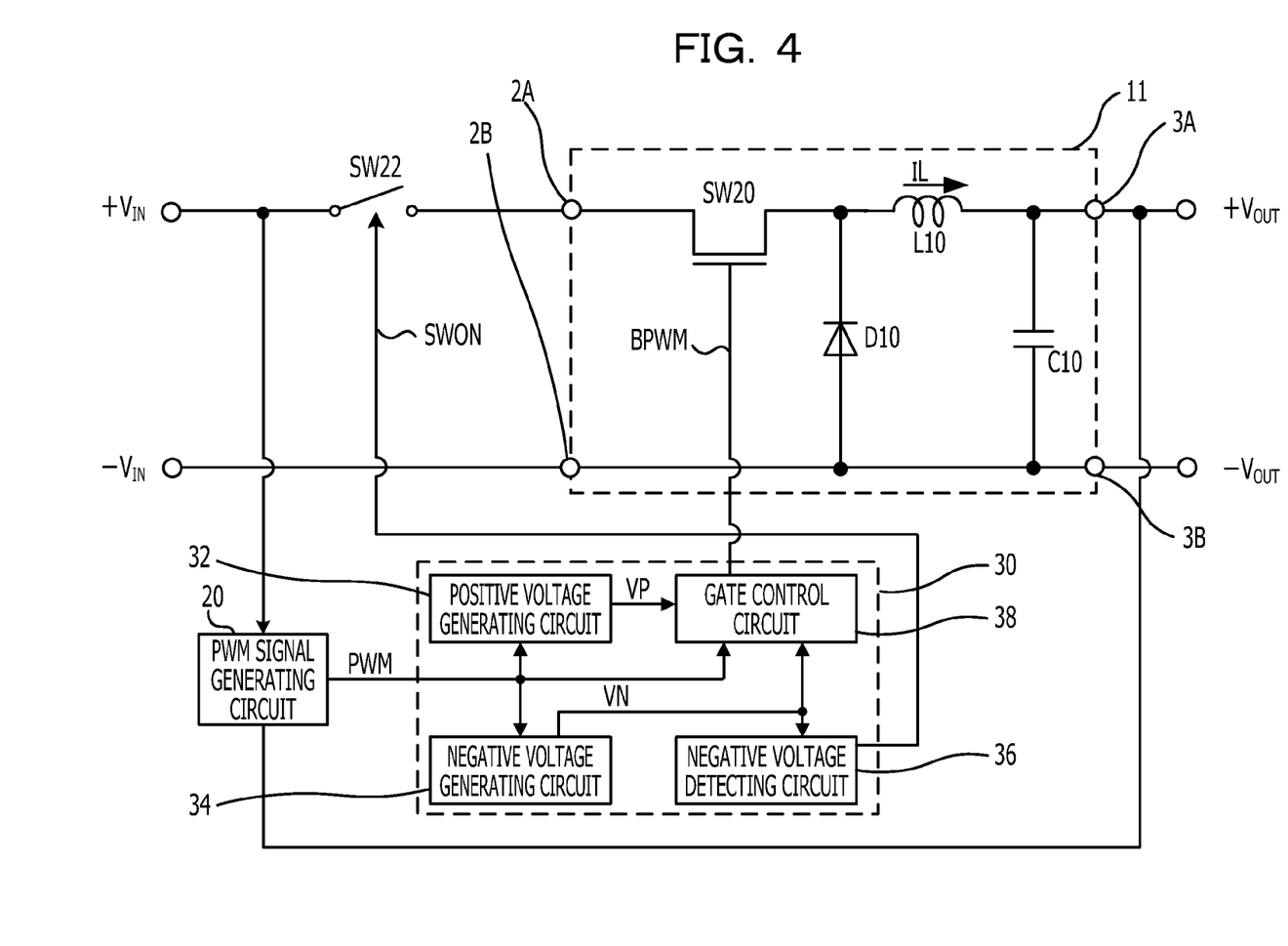
FIG. 4 is a circuit diagram illustrating a step-down converter to which a bias shift circuit is applied according to a first embodiment.

FIG. 4 is a circuit diagram illustrating a first embodiment in which a bias shift circuit is applied to a step-down converter 11 used in a power supply apparatus. In FIG. 4, the same elements and equivalent elements as and to those illustrated in FIG. 1 are designated by like reference numerals, and an explanation thereof will thus be omitted.

The step-down converter 11 includes input terminals 2A and 2B, a switching device SW20 that turns ON or OFF a voltage applied across the input terminals 2A and 2B, a rectifier diode D10, an inductor L10, and a smoothing capacitor C10. The switching device SW20 serves as a main switch.

DC voltages are input from power supply terminals +VIN and −VIN into the input terminals 2A and 2B. An output terminal 3A is a positive terminal from which a DC voltage which has been stepped down by the step-down converter 11 is output. An output terminal 3B is a negative terminal. The output terminals 3A and 3B are connected to +VOUT and −VOUT, respectively, from which voltages to be applied to a load circuit are output. The step-down converter 11 converts, for example, a DC voltage of 385 V into a DC voltage of 12 V and outputs the converted DC voltage to the load circuit.

A PWM signal generating circuit 20, which is similar to the counterpart used in the general step-down converter 10, adjusts the output voltage level of the step-down converter 11 by changing the duty ratio of a PWM signal. The PWM signal generating circuit 20, which is operated in response to a DC voltage which has not stepped down, monitors the output voltage and adjusts the duty ratio of the PWM signal.

A GaN-HEMT is used as the switching device SW20. A GaN-made HEMT has a higher speed and a smaller ON resistance than a silicon-made MOSFET. On the other hand, a GaN-HEMT is, generally, of a normally ON switching type in which the transistor is ON when a voltage is not applied to the gate. Accordingly, in order to switch ON a GaN-HEMT, a negative potential which is equal to or smaller than a threshold has to be applied between the source and the gate. A circuit which applies such a negative potential is a bias shift circuit 30.

The bias shift circuit 30 biases a gate signal of the switching device SW20 and shifts it to the negative side, thereby controlling the ON/OFF operation of the switching device SW20. The bias shift circuit 30 also adjusts the timing at which a PWM signal is output to the switching device SW20. The bias shift circuit 30 also controls the ON/OFF operation of a switch SW22 provided on the side of the drain of the switching device SW20.

The switch SW22 has the following function. Even if the switching device SW20 is caused to remain in the ON state due to an abnormality occurring in the bias shift circuit 30 for some reasons, the switch SW22 turns OFF a current input into the step-down converter 11, thereby protecting the step-down converter 11.

The switch SW22 may be a mechanical switch, such as a relay, or a semiconductor switch, such as a MOSFET. The operating speed of a mechanical switch is, at the fastest, several milliseconds, and thus, it takes time to interrupt a current. On the other hand, a mechanical switch has a low resistance and is inexpensive, and is resistant to an input surge voltage as high as several thousand volts. In contrast, the operating speed of a semiconductor switch is as fast as several microseconds, and thus, a semiconductor switch immediately interrupts a current. On the other hand, a semiconductor switch is less resistant to an input surge voltage and is more expensive than a mechanical switch. Therefore, a mechanical switch and a semiconductor switch have a tradeoff relationship.

The bias shift circuit 30 includes a positive voltage generating circuit 32, a negative voltage generating circuit 34, a negative voltage detecting circuit 36, and a gate control circuit 38.

Figure 5:
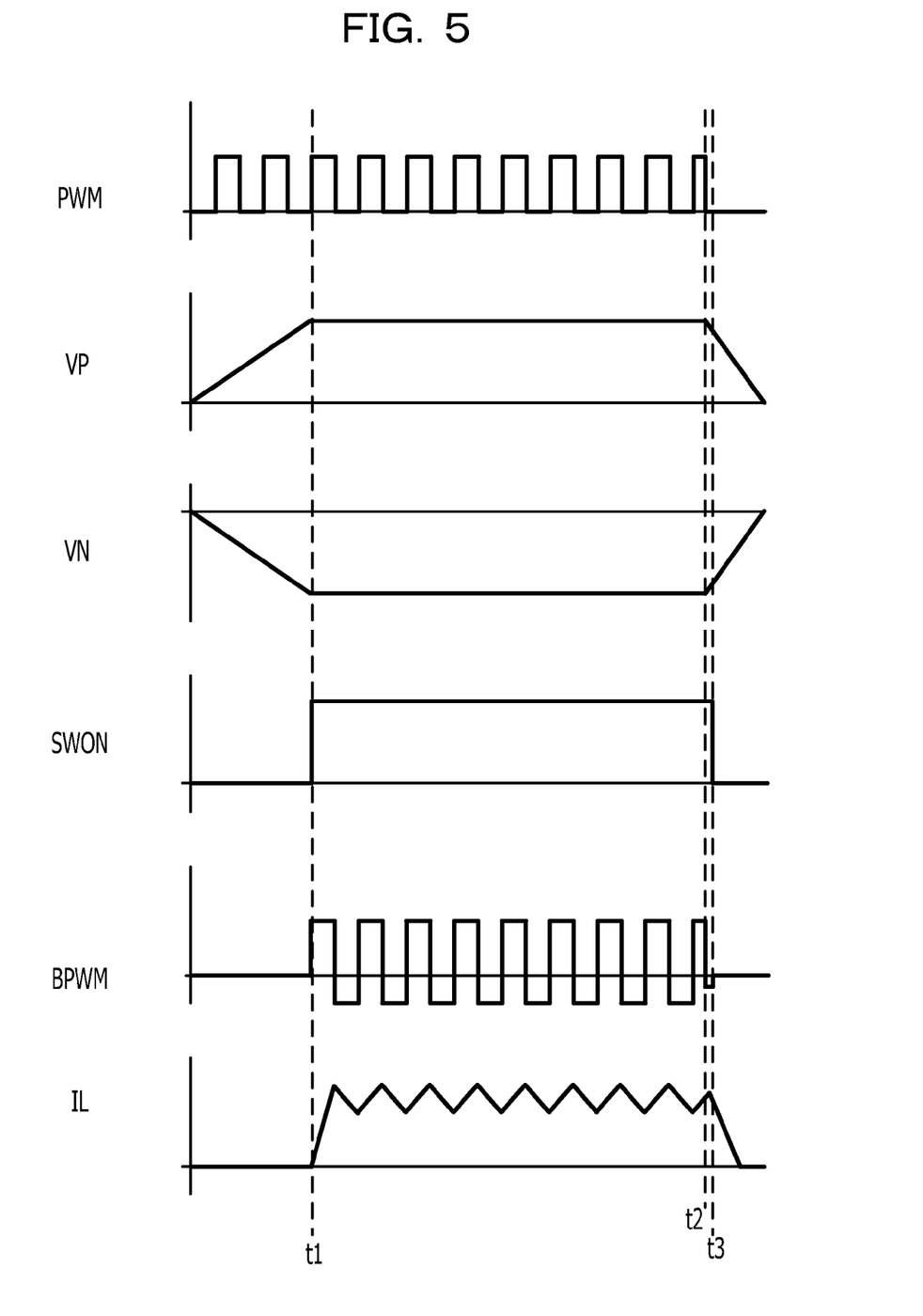
FIG. 5 illustrates an operation of the step-down converter of the first embodiment.

The operation performed by the bias shift circuit 30 will be described below with reference to a timing chart of FIG. 5. In the timing chart, the horizontal axis indicates the time, and the vertical axis indicates a voltage value or a current value.

The positive voltage generating circuit 32 generates a positive voltage VP from a PWM signal output from the PWM signal generating circuit 20. The positive voltage VP has to be equal to or higher than a threshold used for turning ON the normally ON switching device SW20.

The negative voltage generating circuit 34 generates a negative voltage VN from a PWM signal output from the PWM signal generating circuit 20. The negative voltage VN has to be equal to or lower than a threshold used for turning OFF the normally ON switching device SW20.

Upon detecting that the negative voltage VN generated by the negative voltage generating circuit 34 reaches a certain level at time t1, the negative voltage detecting circuit 36 turns ON a SWON signal for controlling the ON/OFF operation of the switch SW22. Then, the drain of the switching device SW20 is connected to the power supply terminal +VIN.

Simultaneously, the gate control circuit 38 outputs a BPWM signal for controlling the ON/OFF operation of the switching device SW20. The BPWM signal is a signal obtained by shifting the zero level of the PWM signal to the negative voltage VN generated by the negative voltage generating circuit 34. This BPWM signal controls the ON/OFF operation of the normally ON switching device SW20, thereby operating the step-down converter 11.

The function of the switch SW22, which is disposed on the side of the drain of the switching device SW20, will now be discussed. In FIG. 5, it is assumed, for example, that a PWM signal has stopped being input into the bias shift circuit 30 for some reasons at time t2. In this case, the positive voltage generating circuit 32 is no longer able to generate a positive voltage VP since it generates a positive voltage VP from a PWM signal. Similarly, the negative voltage generating circuit 34 is no longer able to generate a negative voltage VN since it generates a negative voltage VN from a PWM signal. The level of the negative side of the BPWM signal generated by the gate control circuit 38 is not decreased to the threshold of the switching device SW20 due to a rise in the negative voltage VN, thereby causing the switching device SW20 to remain in the ON state. However, at time t3, upon detecting a rise in the negative voltage VN, the negative voltage detecting circuit 36 turns OFF the SWON signal for controlling the ON/OFF operation of the switch SW22. Since the SWON signal is turned OFF, a current stops flowing through the switching device SW20, thereby discontinuing the operation of the step-down converter 11.

Figure 6:
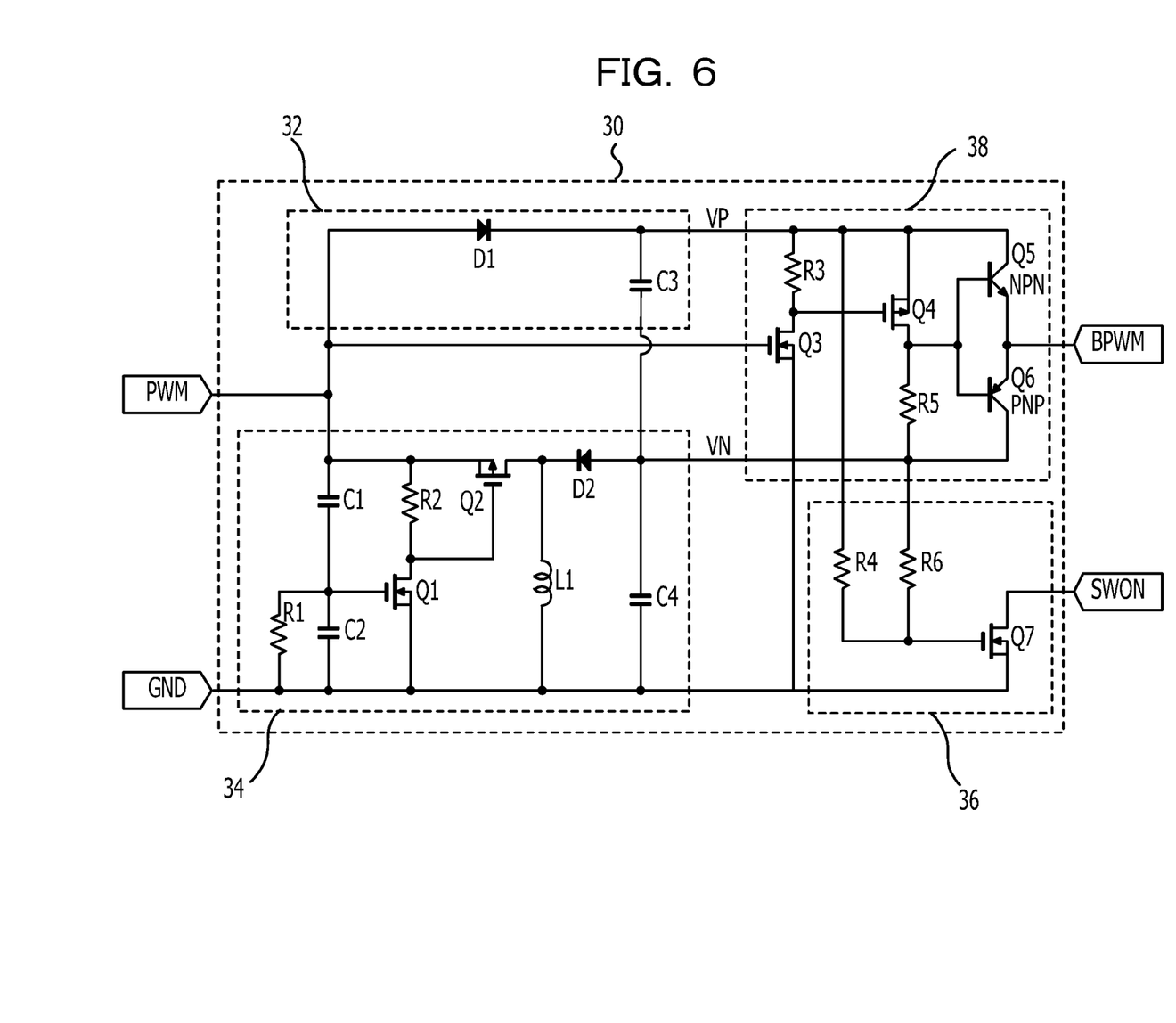
FIG. 6 is a circuit diagram illustrating a bias shift circuit used in the step-down converter of the first embodiment.

FIG. 6 is a specific circuit diagram illustrating the positive voltage generating circuit 32, the negative voltage generating circuit 34, the negative voltage detecting circuit 36, and the gate control circuit 38 in the bias shift circuit 30. As is seen from FIG. 6, these circuits do not have a power supply, and instead, they generate power supplies from energy generated by a PWM signal so as to generate control signals for the switching device SW20 and the switch SW22. As a general negative voltage generating circuit, a dedicated switching power supply circuit is provided in a positive voltage power supply so as to generate a negative voltage. Accordingly, such a negative voltage generating circuit is considerably large. Additionally, the negative voltage generating circuit 34 does not have power supply lines, and thus, it is possible to generate a negative voltage by using a small circuit.

In the first embodiment, in the step-down converter 11, as the switching device SW20, a GaN-HEMT is utilized instead of a MOSFET, thereby making it possible to reduce switching loss. Additionally, the bias shift circuit 30 that shifts the gate voltage of the normally ON GaN-HEMT does not have a large negative power supply generating circuit. Thus, the bias shift circuit 30 may be constituted by a simple, small circuit.

A GaN-HEMT has a high switching speed. Accordingly, even if a load current of the step-down converter 11 sharply changes because the switching frequency f of the switching device SW20 is increased in accordance with a faster period of a PWM signal, a variation in the output voltage is not increased.

The reason for this is as follows. The inductance Lp of a line from the gate control circuit 38 to the gate of the switching device SW20 through which a BPWM signal is transmitted in FIG. 4 is determined as in the following equation (1).

$$Lp \leq 1/(4 \times \pi^2 \times f^2 \times C) \qquad (1)$$

Then, the resonant frequency determined by the parasitic inductance Lp and the gate parasitic capacitance C of a GaN-HEMT is set to be higher than the switching frequency f. This makes it possible to stably supply a switching waveform to the GaN-HEMT, thereby stabilizing the output voltage.

A description will be given below of a second embodiment in which a bias shift circuit is applied to a power factor correction (PFC) circuit included in a power supply apparatus.

Figure 7:
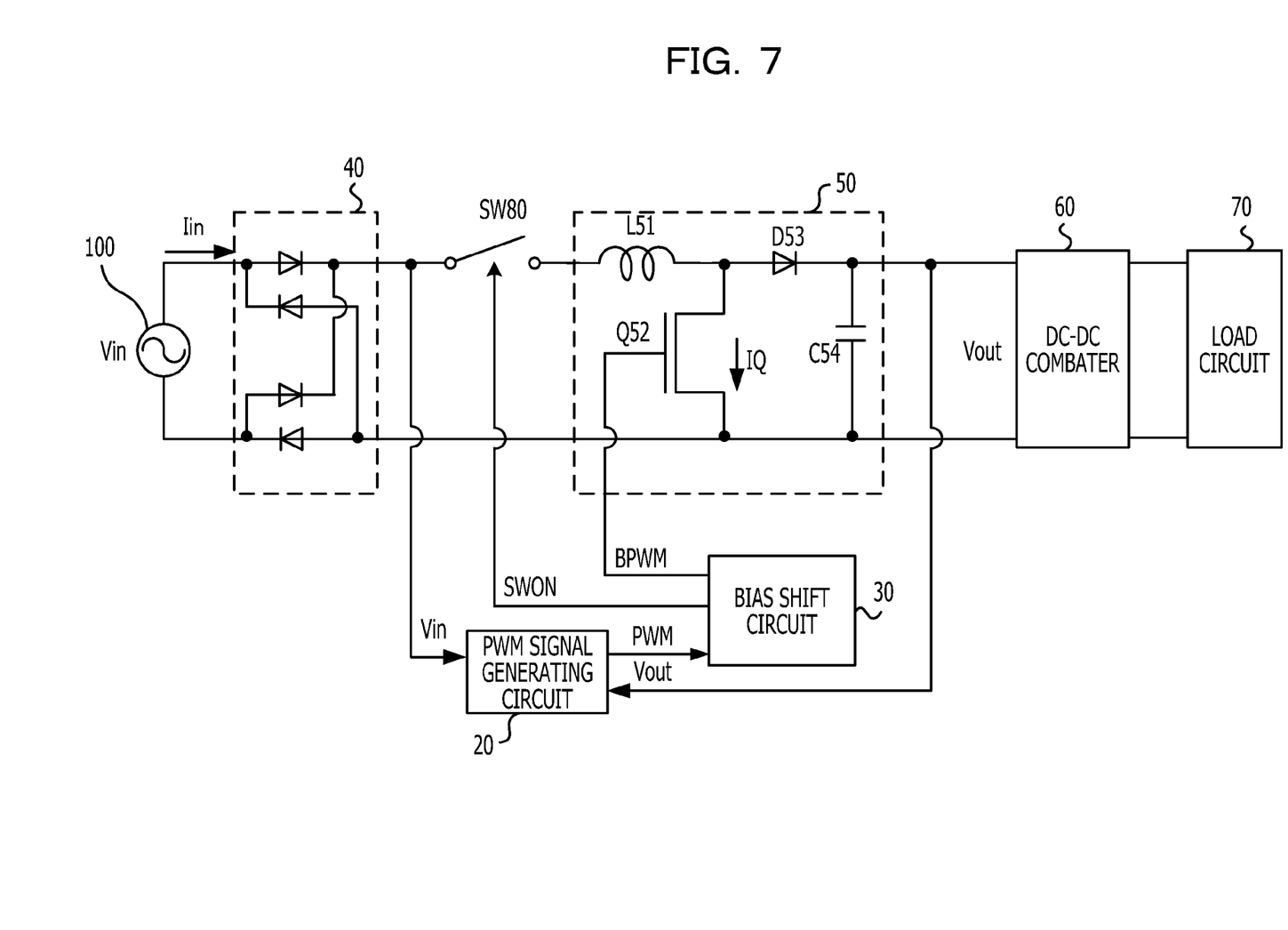
FIG. 7 is a circuit diagram illustrating a power supply apparatus including a power factor correction (PFC) circuit to which a bias shift circuit is applied according to a second embodiment.

FIG. 7 is a circuit diagram illustrating a power supply apparatus including a PFC circuit.

The power supply apparatus illustrated in FIG. 7 includes a rectifier circuit 40, a PFC circuit 50, and a DC-DC converter 60.

The rectifier circuit 40 is a diode bridge obtained by connecting four diodes in a bridge configuration. The rectifier circuit 40 is connected to an alternating current (AC) power supply 100, and performs full-wave rectification for AC power. An AC voltage of, for example, 80 to 265 V is input into the rectifier circuit 40.

The PFC circuit 50 includes an inductor L51, a switching device Q52, a diode D53, and a smoothing capacitor C54, which are connected to one another in a T-shape. The PFC circuit 50 is an active filter circuit which reduces distortion, such as higher harmonics, contained in a current rectified by the rectifier circuit 40, thereby correcting the power factor.

As the inductor L51, a booster inductor, for example, is utilized.

As the diode D53, any type of diode may be utilized as long as the rectifying direction is a direction in which a current flows from the inductor L51 to the smoothing capacitor C54. For example, a fast recovery diode or a SiC Schottky diode may be used.

The smoothing capacitor C54 performs smoothing on a voltage output from the PFC circuit 50 and outputs the smoothed voltage to the DC-DC converter 60.

As the DC-DC converter 60, a forward or full-bridge DC-DC converter may be utilized. A DC voltage of, for example, 385 V is input into the DC-DC converter 60. The DC-DC converter 60 is a conversion circuit that converts the voltage value of DC power, and is connected at its output side to a load circuit 70. In this example, the DC-DC converter 60 converts a DC voltage of 385 V to a DC voltage of 12 V and outputs the converted voltage to the load circuit 70.

A sine wave AC voltage is input into the rectifier circuit 40 as an input voltage Vin. Generally, a load circuit used in a power supply apparatus includes various circuits rather than a simple resistor. Accordingly, only when the input voltage Vin exceeds the voltage across the smoothing capacitor C54, does an input current Iin flow. Thus, the time during which the input current Iin flows is short, and a higher harmonic current having a high peak value flows.

The PFC circuit 50 serves to correct the power factor of a sine wave AC current by turning ON/OFF the switching device Q52 in accordance with the voltage across the input terminals of the load circuit 70.

In the PFC circuit 50, if a MOSFET is used as the switching device Q52, power loss is caused due to a high ON resistance. Accordingly, it is desirable to utilize a GaN-HEMT having a small ON resistance and a high switching speed as the switching device Q52.

In the second embodiment, as well as in the first embodiment, it is possible to reduce switching loss by utilizing a GaN-HEMT as the switching device Q52.

Additionally, an embodiment may be applied to an apparatus that controls power by performing a switching operation, for example, to an inverter for use in a motor control circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A control circuit comprising:
    a first switching device that includes a source, a gate, and a drain;
    a negative voltage generating circuit that generates, from a pulse width modulation signal that controls the gate of the first switching device, a negative potential voltage which is equal to or smaller than a threshold of the first switching device;
    a gate control circuit that outputs a signal obtained by shifting a level of the pulse width modulation signal by an amount equal to the negative potential voltage to the gate of the first switching device;
    a second switching device that is disposed on a side of the drain of the first switching device; and
    a negative voltage detecting circuit that outputs a signal for turning ON the second switching device upon detecting that the negative potential voltage generated by the negative voltage generating circuit has reached a predetermined negative potential.

2. The control circuit according to claim 1, wherein the second switching device is a mechanical switch.

3. The control circuit according to claim 1, wherein the second switching device is a semiconductor switch.

4. The control circuit according to claim 1, wherein the negative voltage detecting circuit outputs a signal for turning OFF the second switching device upon detecting that the negative potential voltage generated by the negative voltage generating circuit has increased to a predetermined negative potential or higher.

5. An electronic apparatus comprising:
    a converter circuit that includes a first switching device having a source, a gate, and a drain;
    a negative voltage generating circuit that generates, from a pulse width modulation signal that controls the gate of the first switching device, a negative potential voltage which is equal to or smaller than a threshold of the first switching device;
    a gate control circuit that outputs a signal obtained by shifting a level of the pulse width modulation signal by an amount equal to the negative potential voltage to the gate of the first switching device;
    a second switching device that is disposed on a side of the drain of the first switching device; and
    a negative voltage detecting circuit that outputs a signal for turning ON the second switching device upon detecting that the negative potential voltage generated by the negative voltage generating circuit has reached a predetermined negative potential.

* * * * *